(12) United States Patent
Wang et al.

(10) Patent No.: US 7,059,927 B2
(45) Date of Patent: Jun. 13, 2006

(54) METHOD FOR MANUFACTURING WHITE LIGHT SOURCE

(75) Inventors: Chien-Yuan Wang, Kaohsiung Hsien (TW); Ru-Shi Liu, Hsinchu Hsien (TW); Liang-Sheng Chi, Yun Lin Hsien (TW); Hung-Yuan Su, Taipei Hsien (TW)

(73) Assignee: Lite On Technology Corporation, Taipei (TW)

( * ) Notice: Subject to any disclaimer, the term of this patent is extended or adjusted under 35 U.S.C. 154(b) by 233 days.

(21) Appl. No.: 10/222,799

(22) Filed: Aug. 19, 2002

(65) Prior Publication Data

US 2004/0032204 A1 Feb. 19, 2004

(51) Int. Cl.
*H01J 9/40* (2006.01)

(52) U.S. Cl. ...................................................... 445/23
(58) Field of Classification Search ............ 445/23–25; 313/485–487, 512, 503; 252/301.4 R, 301.4 S
See application file for complete search history.

(56) References Cited

U.S. PATENT DOCUMENTS

| 5,045,752 A * | 9/1991 | Jansma ....................... 313/487 |
| 6,290,875 B1 * | 9/2001 | Oshio et al. ........... 252/301.4 R |
| 6,380,669 B1 * | 4/2002 | Zachau et al. ............... 313/487 |
| 6,641,448 B1 * | 11/2003 | Wang et al. ................... 445/23 |
| 2004/0124758 A1 * | 7/2004 | Danielson et al. .......... 313/486 |

* cited by examiner

*Primary Examiner*—Joseph Williams
(74) *Attorney, Agent, or Firm*—Birch Stewart Kolasch & Birch LLP

(57) ABSTRACT

A method for manufacturing a white light source includes steps of providing an ultra-violet light as a radiation source, preparing three kinds of first phosphors each receiving the ultra-violet light and emitting the light of red, green and blue, respectively, and preparing at least one additional second phosphor to modify a spectral property of the light emitted by the three first phosphors in order to improve the brightness and color rendering property of the white light source. Moreover, at least one phosphor with the fluorescent property is used as the above second phosphor powder to obtain a color-changeable light source.

8 Claims, 4 Drawing Sheets

METHOD FOR MANUFACTURING WHITE LIGHT SOURCE

FIELD OF THE INVENTION

The present invention relates to a method for manufacturing white light source, especially to a method for manufacturing high-brightness white light source by preparing an ultraviolet light source and a plurality of phosphors.

BACKGROUND OF THE INVENTION

A white light source is generally provided by mixing light sources of different wavelength. For example, a conventional white light source can be realized by mixing the red light, green light and blue light with a suitable intensity ratio. Alternatively, the white light source can be realized by mixing the yellow light and blue light with another suitable intensity ratio. The conventional method for manufacturing white light source can be summarized as following:

In a first prior art of white light source, three LED dies based on AlInGaP, GaN and GaP are packaged into a lamp and emit the red light, blue light and green light, respectively. These lights emitted from the lamp can be mixed by a lens to provide a white light.

In a second prior art white light source, two LED dies based on GaN and AlInGaP serve to emit the blue light and yellowish-green light. The blue light and yellowish-green light are mixed together to provide a white light. The white light sources according to above-mentioned two approaches have an efficiency of 20 lm/W.

A third prior art white light source is proposed by Nichia Chemical co., wherein an InGaN based blue LED and a yellow YAG phosphor are used to provide the white light source. This white light source only requires one uni-color LED to provide the white light at the expense of a smaller efficiency of 15 lm/W. However, the phosphor is a mature art and commercially available, thus the cost of manufacturing this kind of white light source is much more cheaper.

A fourth prior art white light source is proposed by Sumitomo Electric Industries Ltd., which uses a white-light LED based on ZnSe. A CdZnSe thin film is formed on the surface of a ZnSe crystalline substrate and serves to emit the blue light. The ZnSe crystalline substrate emits the yellow light after receiving the blue light of the CdZnSe thin film. The blue light and the yellow light are mixed to provide a white light. In this reference, only one LED chip is required and the operation voltage thereof is 2.7 V, smaller than the 3.5 V operation voltage of the GaN based LED. Moreover, no phosphor is required.

In a fifth approach to provide a white light source, an ultra-violet LED is used to excite a plurality of phosphors such that the phosphors are able to emit lights of different colors for the sake of generating a white light. The phosphors are prepared by following processes:

1. Synthesizing a phosphor powder with a formula of $Y_2O_3$:Eu such as $(Y_{1.9}Eu_{0.1})O_3$ by the solid-state reaction or chemosynthesis method such as citrate sol gel, co-precipitation or micro emulsion method.

2. Synthesizing a phosphor powder with a formula of $SrAl_2O_4$:Eu such as $(Sr_{0.96}Eu_{0.04})Al_2O_4$ by the solid-state reaction or chemosynthesis method such as citrate sol gel, co-precipitation or micro emulsion method.

3. Synthesizing a phosphor powder with formula of $BaMgAl_{10}O_{17}$: Eu, Mn such as $(Ba_{0.9}Eu_{0.1})(Mg_{0.96}Mn_{0.04})$ $Al_{10}O_{17}$ by the solid-state reaction or chemosynthesis method such as citrate sol gel, co-precipitation or micro emulsion method.

4. Measuring the emission spectrum of the above-mentioned three phosphor powders mixed in a predetermined ratio and excited by a 396 nm ultraviolet light. As shown in FIG. 3, the phosphor powder after being excited by a 396 nm ultraviolet light emits a light and color of the light is coordinated with reference to the chromaticity diagram by CIE (commission internationale del'Eclairage) in 1931. The light is marked at point A of the chromaticity diagram, as shown in FIG. 3.

However, light of the light source formed by the combination of three phosphor powders is not as ideal as the natural sun light in the aspects of wavelength distribution and continuousness. The white light thus produced has a relatively poor chroma, which is, even indistinguishable to human eyes, differentiable to the optically sophisticated instrument such as cameras. Therefore, the color rendering property and reproducing ability of this white light source are not satisfactory and it is used mainly for the lighting under some general circumstance.

SUMMARY OF THE INVENTION

It is an object of the present invention to provide a method for manufacturing a high-brightness white light source by integrating an ultraviolet light source and a plurality of phosphors together. Three first phosphors can emit lights of red, green and blue, respectively after being excited by an ultra-violet light to form a white light. Additional second phosphor is provided to modify the spectral property of the white light in order to improve the brightness and color rendering property thereof.

It is another object of the present invention to provide a method for manufacturing color-changeable light source, wherein at least one phosphor with the phosphorescent property is added to a plurality of first phosphor powders such that the color emitted is varied with respect to the time elapsed. Therefore, the present invention provides a color-changeable light source, which is much simpler than the prior art involving with multiple LEDs of different colors or color filters and caps of different colors.

The various objects and advantages of the present invention will be more readily understood from the following detailed description when read in conjunction with the appended drawing, in which:

DETAILED DESCRIPTION OF THE INVENTION

The present invention provides a white light source with an ultra-violet light light-emitting diode serving as a radiation source for generating ultra-violet light and a plurality of phosphors as wavelength conversion medium. The ultra-violet light can be also generated by electron beam, or plasma. In the preferred embodiment of the present invention, first phosphors (or three kinds of first phosphor powders) are provided each for receiving the ultra-violet light from the ultra-violet light light-emitting diode. After being excited by the ultra-violet radiation source, the three first phosphors can respectively emit primary color lights, such as red light (585–640nm), green light (500–570nm) and blue light (430–490 nm). Moreover, an additional second phosphor powder is provided to modify the photic property such as the brightness and chroma of the light source consisting of the three first phosphors. Therefore, the white light source equipped with the four phosphor powders and the ultra-violet light has advantages of high brightness and color rendering property.

The phosphor powders according to the first preferred embodiment of the present invention are prepared by following steps:

1. Synthesizing a phosphor powder with a formula of $Y_2O_3$:Eu such as $(Y_{1.9}Eu_{0.1})O_3$ by solid-state reaction or chemosynthesis method such as citrate sol gel, co-precipitation or micro emulsion method.

2. Synthesizing a phosphor powder with a formula of $SrAl_2O_4$:Eu such as $(Sr_{0.96}Eu_{0.04})Al_2O_4$ by solid-state reaction or chemosynthesis method such as citrate sol gel, co-precipitation or micro emulsion method.

3. Synthesizing a phosphor powder with a formula of $BaMgAl_{10}O_{17}$: Eu, Mn such as $(Ba_{0.9}Eu_{0.1})(Mg_{0.96}Mn_{0.04})Al_{10}O_{17}$ by solid-state reaction or chemosynthesis method such as citrate sol gel, co-precipitation or micro emulsion method.

4. Synthesizing a phosphor powder with a formula of $Y_3Al_5O_{12}$: Ce, Gd such as $(Y_{2.3}Ce_{0.05}Gd_{0.65})$ $Al_5O_{12}$ by solid-state reaction or chemosynthesis method such as citrate sol gel, co-precipitation or micro emulsion method.

Figure 1:
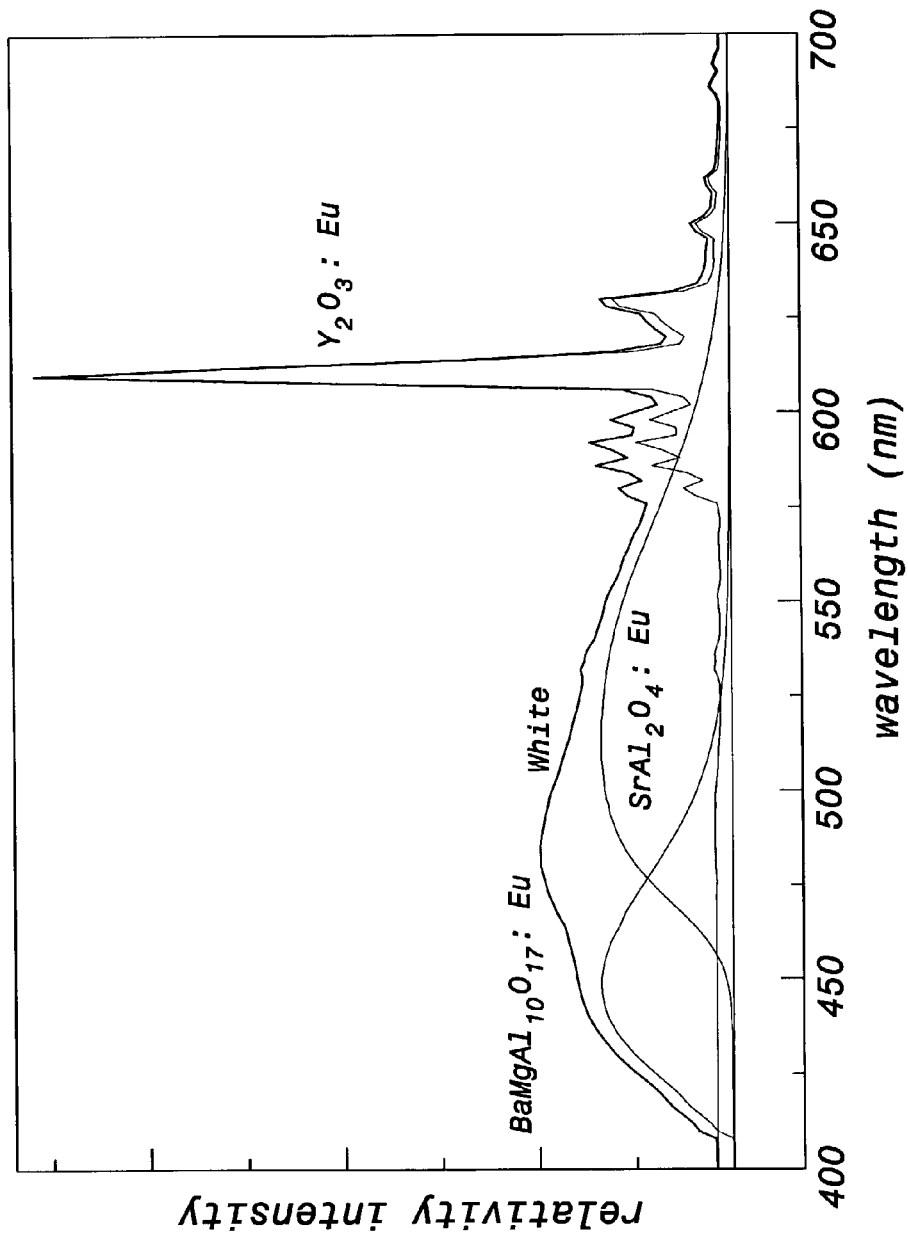
FIG. 1 shows the spectrum of the red light by $Y_2O_3$:Eu phosphor, the green light by $SrAl_2O_4$:Eu phosphor and the blue light by $BaMgAl_{10}O_{17}$: Eu to form a white light in prior art.
Figure 2:
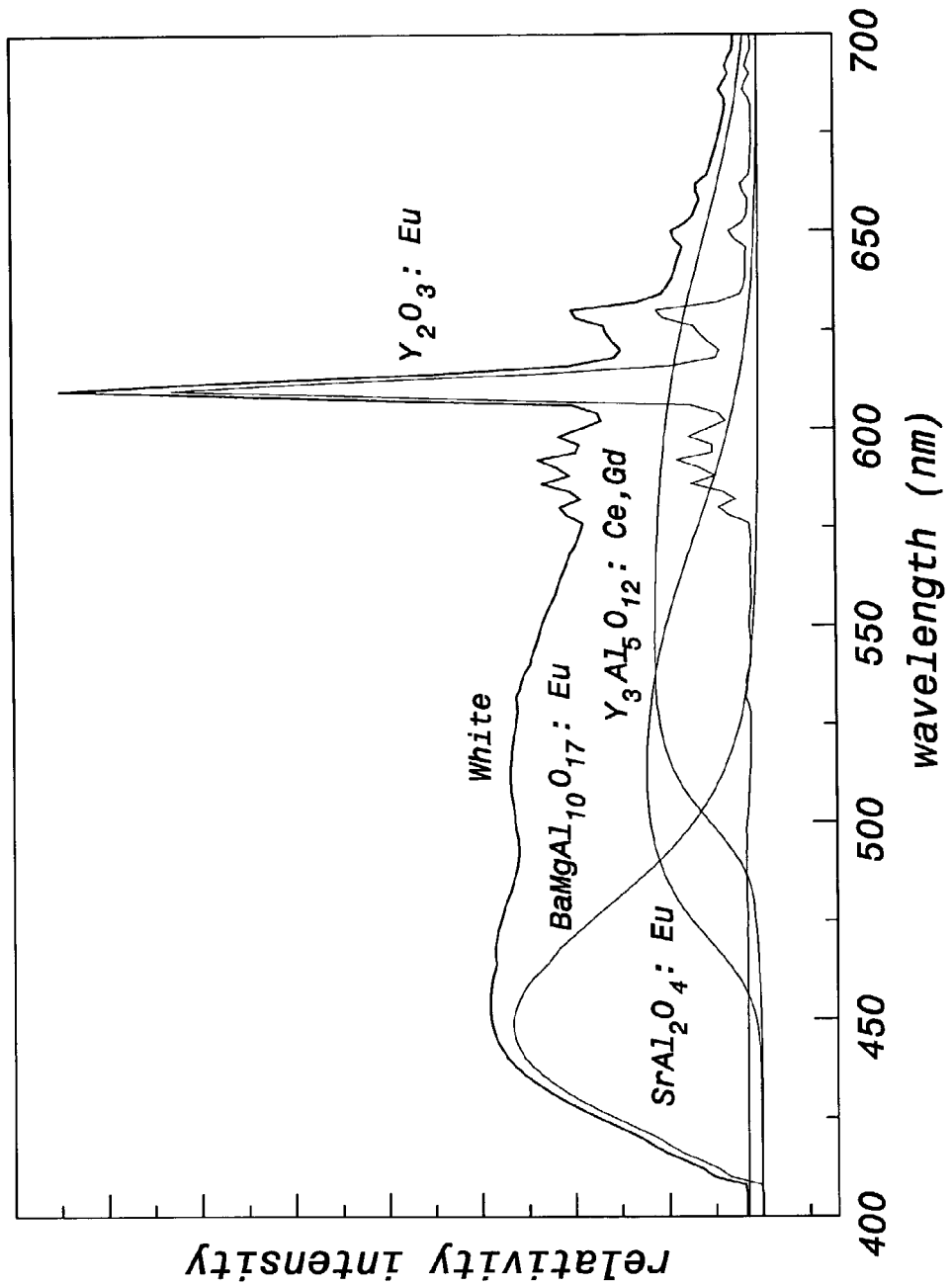
FIG. 2 shows the spectrum of the red light by $Y_2O_3$:Eu phosphor, the green light by $SrAl_2O_4$:Eu phosphor, the blue light by $BaMgAl_{10}O_{17}$: Eu phosphor and the yellow light by $Y_3Al_5O_{12}$: Ce, Gd phosphor to form a white light in the present invention.

5. Measuring the emission spectrum of a mixture of above-mentioned four phosphor powders mixed in predetermined ratio and excited by a 396 nm ultraviolet light. FIG. 2 shows the emission spectrum of the mixture excited by a 396 nm ultraviolet light. The mixture after being excited by a 396 nm ultraviolet light emits a light and the color coordinate of the light is determined with reference to 1931 CIE (commission internationale del'Eclairage) chromaticity diagram, which is marked as "B" in FIG. 3.

The present invention also provides a color-changeable white light-emitting diode light source, wherein at least one phosphorescent powder (or phosphorescent phosphor) with phosphorescent property is provided to add into the three first phosphors such that a colored light emitted from the phosphorescent phosphor has a color which varies with respect to time when provision of the radiation source is stopped. The phosphorescent powder is selected from a group consisting of $SrAl_2O_4$:Eu,M $CaAl_2O_4$:Eu,M $Sr_4Al_{14}O_{25}$:Eu,M $Y_2O_2S$:Eu,M and ZnS:Cu,M, wherein M is transition metal or rare earth element.

The powders for the color-changeable LED light source are prepared by following steps:

1. Synthesizing a phosphor powder with a formula $Y_2O_3$: Eu such as $(Y_{1.9}Eu_{0.1})O_3$ by the solid-state reaction or chemosynthesis method such as citrate sol gel, co-precipitation or micro emulsion method.

2. Synthesizing a phosphor powder with a formula $SrAl_2O_4$:Eu,Dy such as $(Sr_{0.94}Eu_{0.04}Dy_{0.02})Al_2O_4$ by solid-state reaction or chemosynthesis method such as citrate sol gel, co-precipitation or micro emulsion method.

3. Synthesizing a phosphor powder with a formula $BaMgAl_{10}O_{17}$: Eu, such as $(Ba_{0.9}Eu_{0.1})MgAl_{10}O_{17}$ by solid-state reaction or chemosynthesis method such as citrate sol gel, co-precipitation or micro emulsion method.

4. Synthesizing a phosphor powder with a formula $Y_3Al_5O_{12}$: Ce, Gd such as $(Y_{2.3}Ce_{0.05}Gd_{0.65})$ $Al_5O_{12}$ by solid-state reaction or chemosynthesis method such as citrate sol gel, co-precipitation or micro emulsion method.

Figure 4:
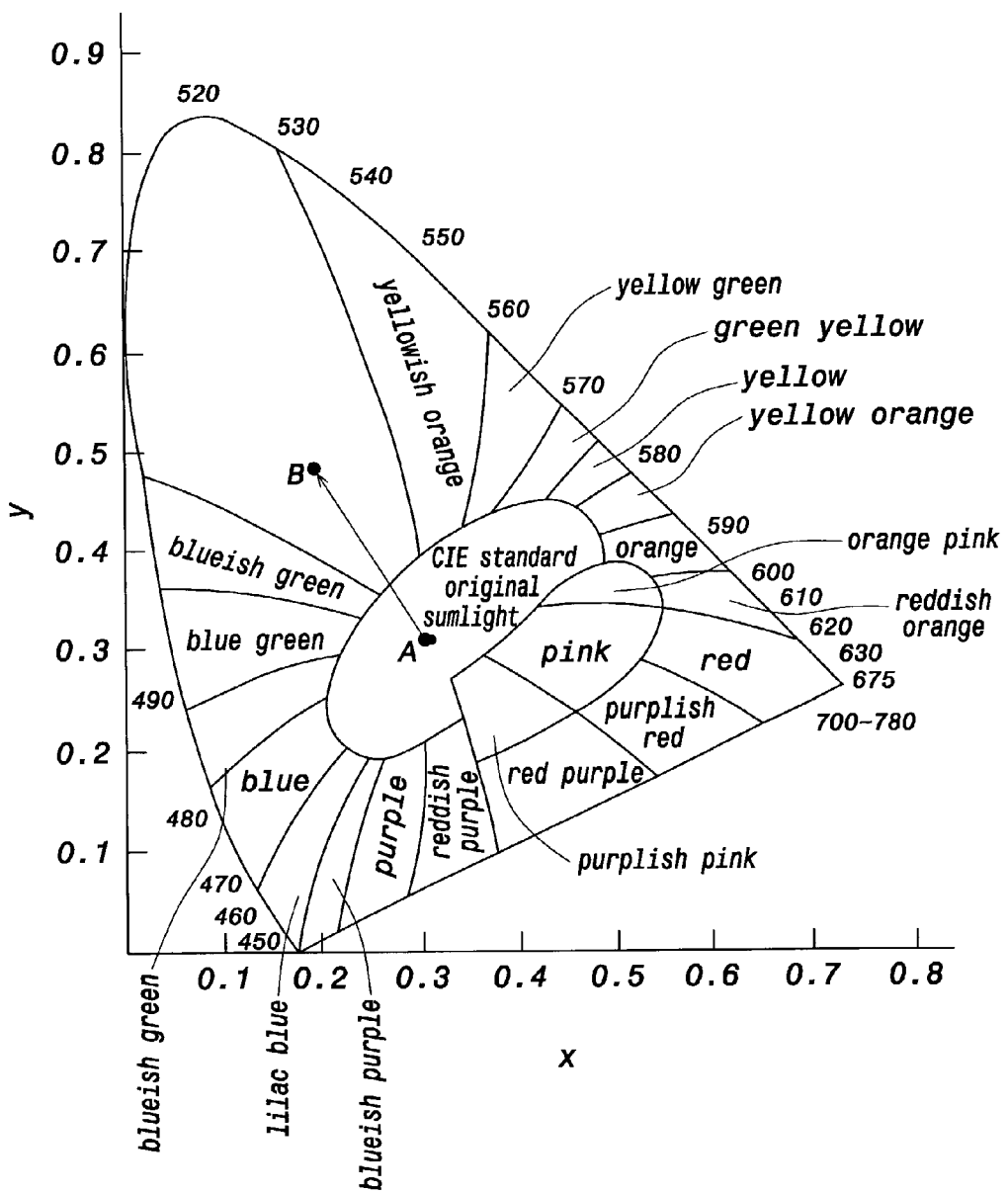
FIG. 4 shows the contour in CIE chromaticity diagram for the light emitted by the mixture of $Y_2O_3$:Eu phosphor, $SrAl_2O_4$:Eu, Dy phosphor, $BaMgAl_{10}O_{17}$: Eu phosphor and $Y_3Al_5O_{12}$: Ce, Gd phosphor, wherein the mixture is illuminated by an ultra-violet light and then the ultra-violet light is removed.

5. Measuring the emission spectrum of a mixture of above-mentioned four phosphor powders mixed in a predetermined ratio and excited by a 396 nm ultraviolet light. FIG. 2 shows the emission spectrum of the mixture excited by a 396 nm ultraviolet light. The mixture is excited by a 396 nm ultraviolet light and afterward the ultraviolet light is removed. The light emitted from the mixture is measured and coordinated in the chromaticity diagram, as shown in FIG. 4. The color temperature is moved from point A to point B as time elapsed.

Table 1 shows the comparison between the prior art white light sources and the first preferred embodiment of the present invention in the CIE color temperature coordinate, color rendering property and color temperature.

TABLE 1

|  | prior art | first preferred embodiment |
|---|---|---|
| CIE chromaticity coordinates | (0.3130, 0.3254) | (0.3120, 0.3285) |
| color rendering property | 85 | 94 |
| color temperature | 6524 K | 6550 K |

Figure 3:
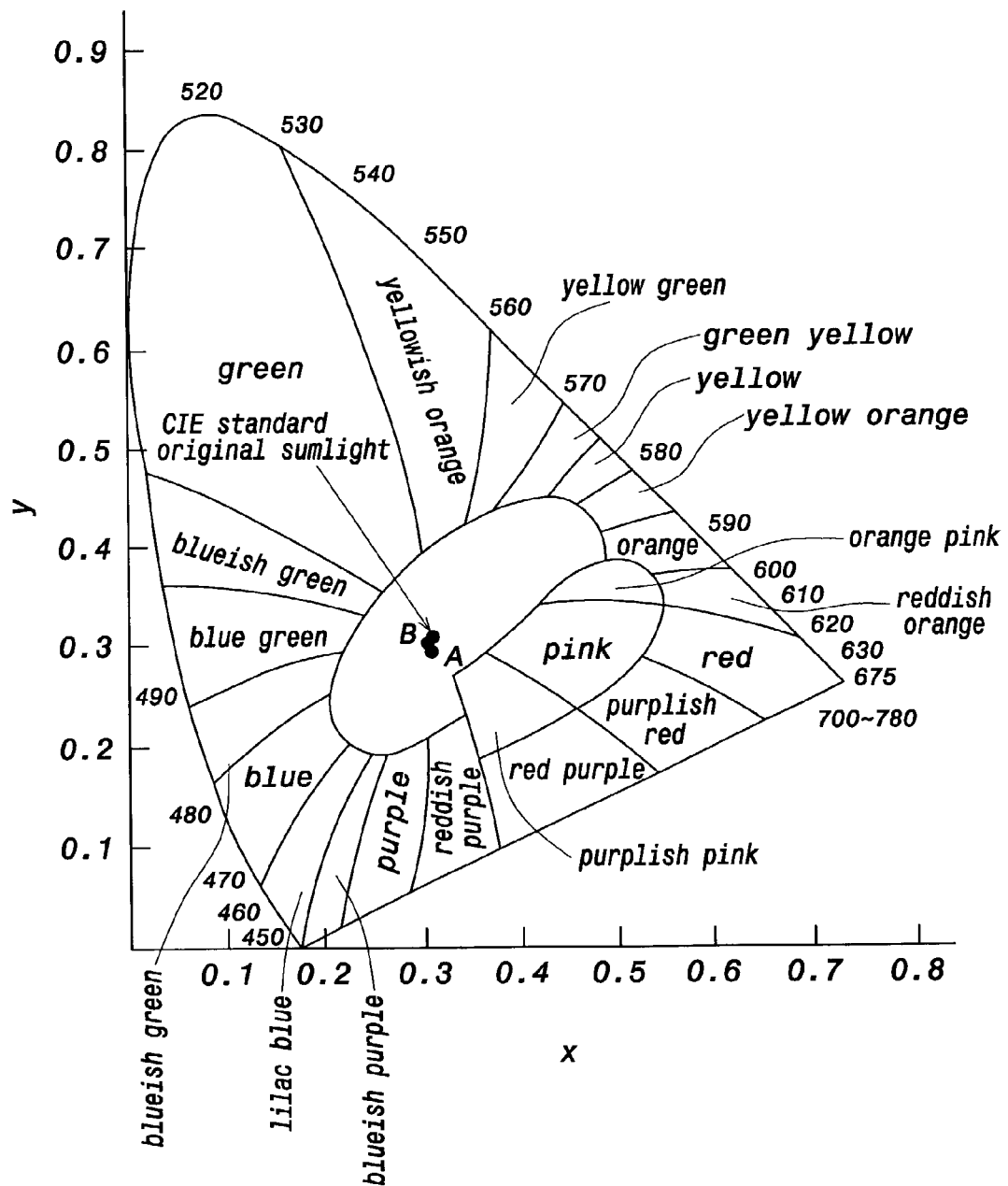
FIG. 3 shows the color temperature A for FIG. 1 and B for FIG. 2 in the CIE chromaticity diagram.

The present invention has following effects:

1. As can be seen in FIG. 3, the white light source of the first preferred embodiment is a standard white light source with temperature coordinated at (0.3120, 0.3285) in the chromaticity diagram, which is similar to the prior art white light source with its temperature coordinated at (0.3130, 0.3254).

2. The prior art white light source has a color rendering property of 85 and color temperature of 6524K; while the white light source of the first preferred embodiment has a color rendering property of 94 and color temperature of 6550K. In the first preferred embodiment, yellow phosphor powder of $Y_3Al_5O_{12}$: Ce, Gd is added to modify the spectrum of the white light source. The color rendering property of the white light source: of the first preferred embodiment is improved to be as same as the true sunlight.

3. The emission spectrum of the white light source of the present invention is modified by the yellow phosphor powder of $Y_3Al_5O_{12}$: Ce, Gd; and bluish green phosphor powder of $BaMgAl_{10}O_{17}$: Eu, Mn (the bluish degree of the light depends on ratio of the amount of Eu and Mn). Both lights are close to the green light, which is the most sensitive color of light for human eyes. Therefore, the white light source of the present invention has a better efficiency.

4. As shown in FIG. 4, one of the three first phosphors of the white light source of the present invention is a phosphor powder $((Sr_{0.94}Eu_{0.04}Dy_{0.02})Al2O4)$ emitting green phosphorescent light (long afterlight characteristics). Therefore, the light emitted from the white light source of the present invention is turned from the white light to the green light after the exciting source is removed (or provision of the radiation source is stopped) and the green light can sustain for a long time, i.e. the first phosphor with the phosphorescent property can emit a colored light having a color which varies with respect to time. The emitted light becomes more diverse if two of more phosphorescent powders are involved and excited by the ultraviolet light source such as the 396 nm ultraviolet light. The powders are packaged and then illuminated by the ultraviolet light for a period of time, thus obtaining a color-changeable LED light source.

Although the present invention has been described with reference to the preferred embodiment thereof, it will be understood that the invention is not limited to the details thereof. Various substitutions and modifications have suggested in the foregoing description, and other will occur to those of ordinary skill in the art. For example, those light source with first phosphors powders covering the wavelength regimes of red light (585–640 nm), green light (500–570 nm) and blue light (430–490 nm) as well as at least one additional second phosphors powder for modifying the spectrum of the white light source to achieve the comparatively high brightness and high color rendering property, falls into the scope of the present invention. Moreover, the present invention also includes the method of fabricating a color-changeable LED light source, wherein at least one phosphor with fluorescent property is used as the above second phosphor powder to obtain a color-changeable light source. Therefore, all such substitutions and modifications are intended to be embraced within the scope of the invention as defined in the appended claims.

We claim:

1. A method for manufacturing a white light-emitting diode light source capable of producing a color-variable light with respect to time, comprising:
    providing an ultra-violet light light-emitting diode serving as an excitation source;
    providing three first phosphors capable of emitting colored lights of red, green and blue color, respectively;
    wherein at least one of said three first phosphors has a phosphorescent property;
    exciting said three first phosphors by provision of the excitation source for producing a white light; and
    stopping the provision of the excitation source, wherein said at least one colored light of said at least one first phosphor with the phosphorescent property is sustained for a long time and has a color which varies with respect to time;
    wherein said at least one of said three first phosphors is selected from the group consisting of $Sr_4Al_{14}O_{25}$:Eu,M; $Y_2O_2S$:Eu,M and ZnS:Cu,M, wherein M is a transition metal or a rare earth element.

2. The method as claimed in claim 1, further comprising:
    providing a second phosphor for emitting a different color of light from the lights emitted by said three first phosphors and capable of modifying a spectral property of white light formed by the lights emitted by said three first phosphors.

3. The method as claimed in claim 2, wherein said second phosphor is selected from the group consisting of $Y_3Al_5O_{12}$:Ce,Gd and $BaMgAl_{10}O_{17}$:Eu,Mn.

4. A method for manufacturing a white light-emitting diode light source capable of producing a color-variable light with respect to time, comprising:
    providing an ultra-violet light light-emitting diode serving as an excitation source;
    providing three first phosphors capable of emitting colored lights of red, green and blue color, respectively;
    providing at least one phosphorescent phosphor capable of emitting at least one colored light;
    exciting said three first phosphors and at least one phosphorescent phosphor by provision of the excitation source for producing a white light; and
    stopping the provision of the excitation source, wherein said at least one colored light of said at least one phosphorescent phosphor is sustained for a long time and has a color which varies with respect to time;
    wherein said at least one of said three first phosphors is selected from the group consisting of $Sr_4Al14O_{25}$:Eu,M; $Y_2O_2S$:Eu,M and ZnS:Cu,M, wherein M is a transition metal or a rare earth element.

5. The method as claimed in claim 4, further comprising:
    providing a second phosphor for emitting a different color of light from the lights emitted by said three first phosphors and capable of modifying a spectral property of the white light formed by the lights emitted by said three first phosphors and said at least one second phosphor.

6. The method as claimed in claim 5, wherein said second phosphor is selected from the group consisting of $Y_3Al_5O_{12}$:Ce,Gd and $BaMgAl_{10}O_{17}O_{17}$:Eu,Mn.

7. A light-emitting method for producing a color-variable light with respect to time, comprising:
    providing an ultra-violet light light-emitting diode serving as an excitation source;
    providing three first phosphors capable of emitting colored lights of red, green and blue color, respectively;
    wherein at least one of said three first phosphors has a phosphorescent property;
    exciting said three first phosphors by provision of the excitation source for producing a white light; and
    stopping the provision of the excitation source for initiating said at least one colored light of said at least one first phosphor with the phosphorescent property having a color which varies with respect to time; wherein said at least one of said three first phosphors is selected from the group consisting of $SrAl_2O_4$:Eu,M; $CaAl_2O_4$:Eu,M; $Sr_4Al_{14}O_{25}$:Eu,M; $Y_2O_2S$:Eu,M and ZnS:Cu,M, wherein M is a transition metal or a rare earth element.

8. The light-emitting method as claimed in claim 7, wherein said at least one of said three first phosphors is selected from the group consisting of $Sr_4Al_{14}O_{25}$:Eu,M; $Y_2O_2S$:Eu,M and ZnS:Cu,M, wherein M is a transition metal or a rare earth element.

* * * * *